United States Patent [19]
Mendolia

[11] Patent Number: 5,910,025
[45] Date of Patent: Jun. 8, 1999

[54] EDGE INTERFACE ELECTRICAL CONNECTORS

[75] Inventor: Gregory S. Mendolia, Forest, Va.

[73] Assignee: Ericsson, Inc., Research Triangle Park, N.C.

[21] Appl. No.: 08/962,494

[22] Filed: Oct. 31, 1997

[51] Int. Cl.[6] ...................................................... H01R 9/09
[52] U.S. Cl. ............................................ 439/76.1; 439/951
[58] Field of Search ........................... 439/81, 76.1, 500, 439/929, 59, 95, 951

[56] References Cited

U.S. PATENT DOCUMENTS

5,419,708   5/1995   Koss et al. ................................. 439/59

Primary Examiner—Steven L. Stephan
Assistant Examiner—Javaid Nasri
Attorney, Agent, or Firm—Myers Bigel Sibley & Sajovec, P.A.

[57] ABSTRACT

Edge interface electrical connectors 75 and configurations for electrical devices such as radiotelephones position electrical contacts 55 on a lateral or edge surface of a printed circuit board 110, 110A and employ spring contacts 74 to interconnect other components such as batteries 60 or other accessories therewith.

22 Claims, 5 Drawing Sheets

(BEFORE)

FIG. 11A (DURING)

FIG. 11B (AFTER)

FIG. 11C

EDGE INTERFACE ELECTRICAL CONNECTORS

FIELD OF THE INVENTION

The present invention relates generally to electrical connectors. More particularly, the present invention relates to electrical contact configurations for components used with electronic devices such as radiotelephones.

BACKGROUND OF THE INVENTION

Radiotelephones continue to grow in popularity because they enable flexible channels of communication. Conveniently, increasing numbers of radio-towers and satellite systems are generally each increasing user access to radiotelephone systems, even in rural or remote areas. This increased popularity produces a sophisticated consumer who can demand competing product specifications or criteria. For example, desired performance parameters typically include improved signal quality, operational features, and durability, while maintaining an aesthetically pleasing appearance. In addition, many users desire improved transportability, which in turn, generally dictates that the product configuration be provided as a slim and miniaturized design which can impact other performance parameters.

As noted above, many of the more popular hand-held telephones are undergoing miniaturization. Indeed, many of the contemporary models are only 11–12 centimeters in length. Portable radiotelephones employ an internally disposed printed circuit board which generally controls the operation of the radiotelephone. Because the printed circuit board is disposed inside the radiotelephone, its size is also shrinking, corresponding to the miniaturization of the portable radiotelephone. Unfortunately, desirable operational and performance parameters of the radiotelephone can potentially require a large amount of dedicated space on the surface of the printed circuit board. Therefore, it is desirable to efficiently and effectively utilize the limited space on the printed circuit board.

This miniaturization can also create complex mechanical and electrical connections with other components, such as exterior mounted accessories and batteries which must generally interconnect with the housing for mechanical support and to the internally disposed printed circuit board for electrical interconnection. For example, battery connections traditionally have been constructed by spring contacts which are mounted in an intermediate position in the housing such that they longitudinally extend between the housing and printed circuit board (ie., are sandwiched) to rest against on the contacts on the surface of the printed circuit board. Unfortunately, this configuration can position the electrical contacts relatively close together which can potentially allow users to inadvertently short circuit the contacts. This can occur when a user positions a conductive object such as metallic keys in close proximity to the telephone systems connector or loose spare battery such that the key(s) shorts across the two contacts. Additionally, the configuration typically requires a dedicated keep-out zone in an area adjacent the contacts on the printed circuit board because the ends of the spring contacts can deform and extend into proximate areas around the contact pads themselves. Unfortunately, this keep-out zone can waste valuable board space.

Figure 1A:
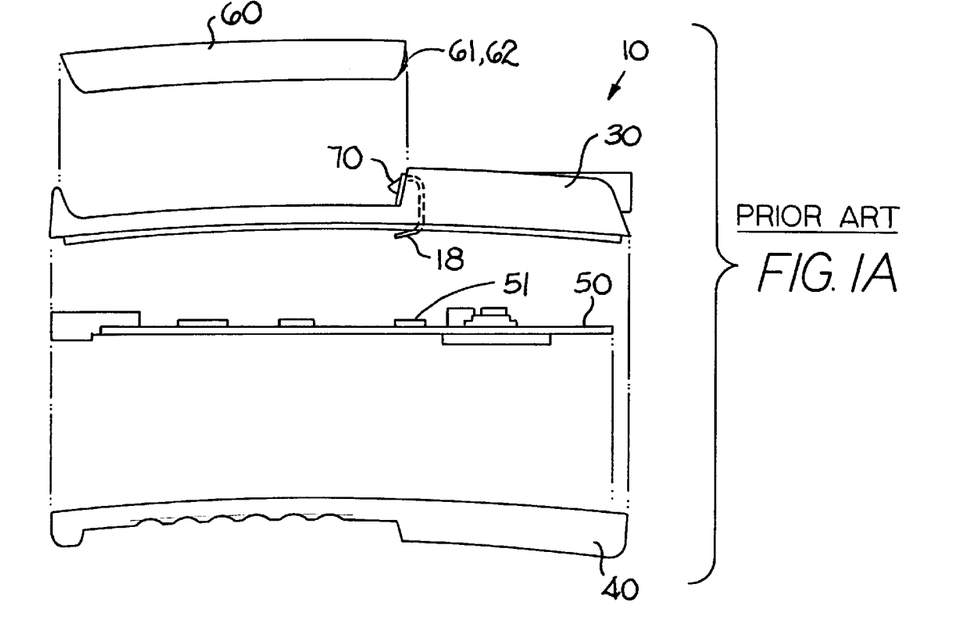
FIG. 1A illustrates a prior art battery to printed circuit board connection in a radiotelephone.
Figure 1B:
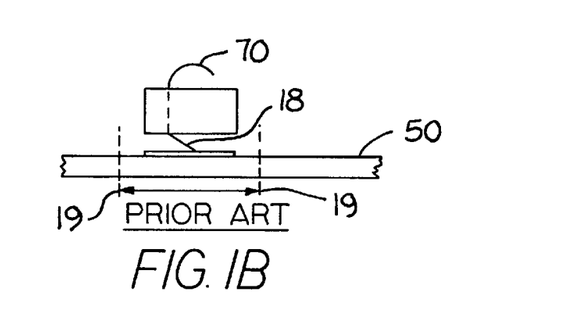
FIG. 1B illustrates a prior art connector as assembled to a printed circuit board.
Figure 2A:
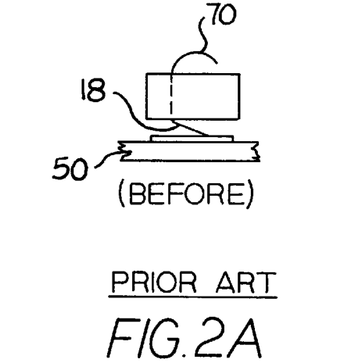
FIG. 2A illustrates the prior art connector of FIG. 1B before an external force is exerted thereon.
Figure 2B:
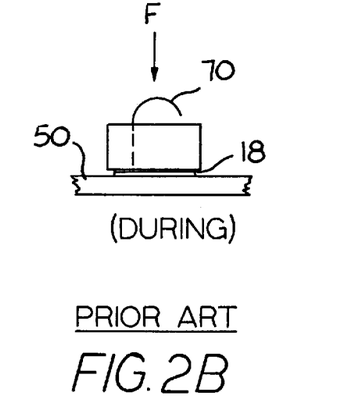
FIG. 2B illustrates the prior art connector of FIG. 1B as deflected by an external force.
Figure 2C:
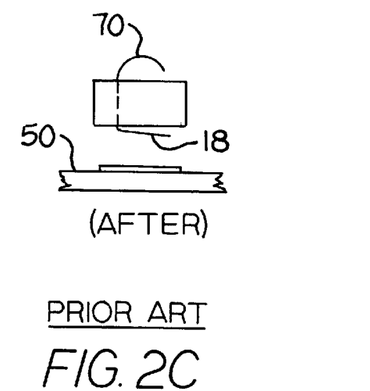
FIG. 2C illustrates the prior art connector of FIG. 1B after structural deformation.

FIGS. 1A and 1B illustrate one example of a conventional portable radiotelephone 10 with spring connectors 70 used to interconnect the battery 60 through the housing 30 to the printed circuit board 50. The spring connector 70 forms a contact angle 18 with the printed circuit board 50 surface when assembled. As shown in FIG. 1B, the connector 70 is configured to rest against the printed circuit board contact pads 51, 52 and is typically associated with an adjacent keep-out zone 19. Thus, as shown in FIGS. 2A–2C, when an external force is introduced onto the connector 70, it is trapped by the surface of the printed circuit board and deformed. Unfortunately, this deformation can introduce permanent structural instabilities into the electrical contact potentially causing electrical malfunction or substandard performance. Further, this interconnection configuration generally uses a relatively large mounting or contact area on the surface of the printed circuit board 50.

OBJECTS AND SUMMARY OF THE INVENTION

It is therefore an object of the present invention to provide improved radiotelephone interconnections for accessories and power supplies.

It is a further object of the present invention to provide an electronic connector interface which minimizes the amount of surface space needed on the printed circuit board.

It is an additional object of the invention to provide a connector which is easy to manufacture and resistant to inadvertent short circuiting by end users.

It is a further object of the invention to provide a radiotelephone with a battery interconnection configuration which is resistant to structural deformations introduced by external forces.

These and another objects, advantages, and features are provided by an edge interface connector which electrically interconnects a desired component to a printed circuit board disposed in a device such as a radiotelephone. In particular, a first aspect of the invention is a radiotelephone which includes a front housing member and a rear housing member. The rear housing member is configured to overlay and matably connect with the front housing member to provide a channel therebetween. The rear housing member includes a battery chamber therein. The radiotelephone also includes a printed circuit board disposed in the channel intermediate of the front and rear housing members. The printed circuit board comprises a pair of battery edge contact pads thereon. The radiotelephone further includes at least one and typically a plurality of elongated spring contacts positioned in an end portion of the housing rear member such that said spring contacts electrically contact the printed circuit board battery edge contact pads. Preferably, the elongated spring contacts are positioned and configured such that they are free to vertically extend and retract about the printed circuit board according to external forces exerted thereon. Advantageously, unlike many conventional connectors, this configuration can reduce the potential for undesired deformation of the spring contacts.

In a preferred embodiment, the plurality of spring contacts include at least two contacts which are positive and negative spring contacts. The positive and negative spring contacts have upper and lower portions. A battery is positioned in the housing chamber such that the upper portions of the positive and negative spring contacts engage the respective battery positive and negative end contacts and the lower end portions contact corresponding ones of the battery edge contacts on the printed circuit board, defining a battery circuit therebetween. Advantageously, the positive and negative terminals and edge contacts can be spaced-apart, for example, on opposing sides of the printed circuit board, to minimize the potential for short circuiting across the terminals by an end user and reduces the use of valuable board space. This type of spreading or spacing of the contacts is not practical with conventional connector technology.

In an additional preferred embodiment, the elongated spring contacts include a support body positioned to hold the spring contact elements in proper alignment in the housing to assure electrical contact with the printed circuit board contact pads on one end and the component or externally mounted accessory (such as a battery) on the other end.

Accordingly, the edge interface connection is configured to be structurally flexible such that when a spring contact is assembled to the radiotelephone it minimizes the amount of space needed to electrically engage with the printed circuit board such that the elongated spring contact is free to vertically extend and retract about said printed circuit board according to external forces exerted thereupon.

An additional aspect of the present invention is an edge interface electrical connection. The connection comprises a connector support body having first and second sides and at least one connector upper contact extending from a first side of the support body. The connection also comprises at least one connector lower contact extending from a second side of the support body, wherein each of the connector upper contacts are electrically connected to corresponding ones of the at least one connector lower contacts. The connection further includes a printed circuit board having longitudinal and lateral surfaces and comprising at least one lateral edge contact pad on at least one lateral surface. The connector lower contact extends from the support body to a lateral surface of the printed circuit board to rest against and electrically connect with the printed circuit board edge contact pad. Preferably, the connector lower contact is configured in the support body such that it is free to extend upwardly and downwardly about the printed circuit board in response to forces exerted thereon.

In a preferred embodiment, the edge interface connector lower contact includes first and second segments. The second segment extends at an angle with respect to the first segment, and the second segment engages with the lateral edge contact such that it is free to extend upwardly and downwardly about the printed circuit board in response to forces exerted thereon. This configuration advantageously provides a larger contact surface to assure electrical contact between the lower contact and the printed circuit board, and can also provide a greater spring force to position the lower contact firmly against the desired printed circuit board contact. In one embodiment, the printed circuit board lateral edge contact includes electrical contact pads positioned in at least one cutaway inset in said printed circuit board. This cutaway can be electrically connected to the circuit on the printed circuit board, for example, with electrical vias therein.

The foregoing and other objects and aspects of the present invention are explained in detail in the specification set forth below.

DESCRIPTION OF PREFERRED EMBODIMENTS

The present invention will now be described more fully hereinafter with reference to the accompanying figures, in which preferred embodiments of the invention are shown. This invention may, however, be embodied in many different forms and should not be construed as limited to the embodiments set forth herein. Like numbers refer to like elements throughout. Dimensions may be exaggerated for clarity. As used herein, the term "printed circuit board" is meant to include any microelectronics packaging substrate.

Figure 3:
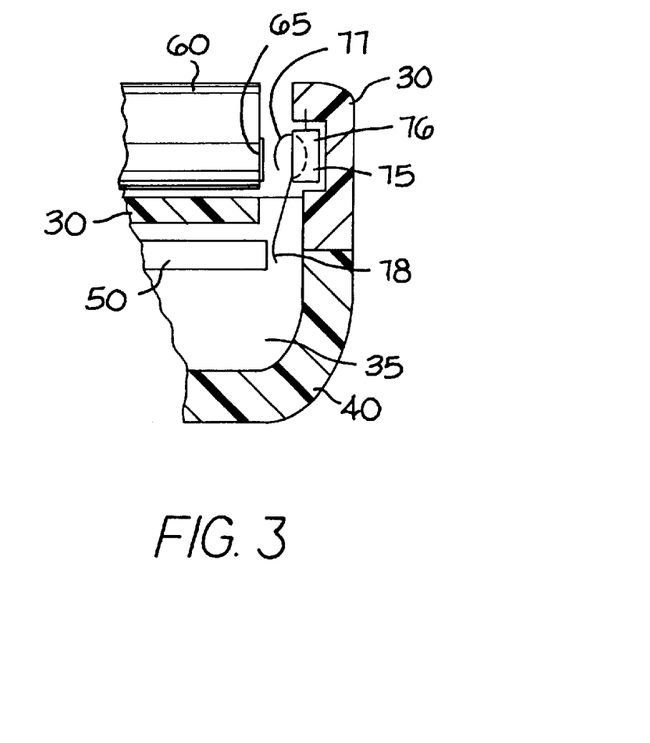
FIG. 3 is a sectional perspective view illustrating an edge interface connection of one embodiment of the present invention.
Figure 4:
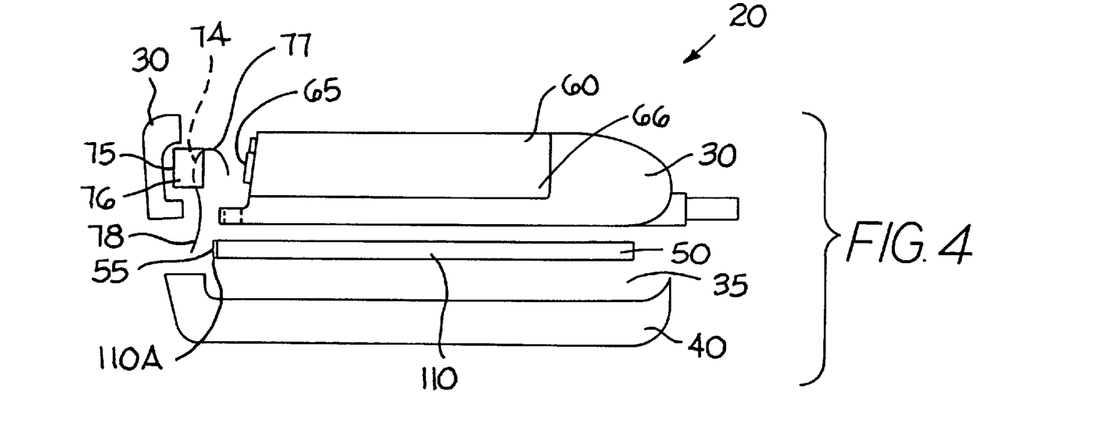
FIG. 4 is an exploded view of a radiotelephone employing the embodiment of the present invention shown in FIG. 3.

FIGS. 3 and 4 illustrate a preferred embodiment of the present invention. As shown in FIG. 4, the radiotelephone 20 includes a rear housing member 30 and a front housing member 40. The front and rear housing members 30, 40 are preferably sized and configured to matably connect together such that they form a channel or chamber 35 therebetween. A printed circuit board 50 is positioned in the channel 35 between the front and rear housing members 30, 40. The radiotelephone 20 also typically includes a battery 60 associated therewith. Preferably, the battery 60 is mounted in a battery chamber 66 formed in an externally accessible and exposed surface of the rear housing 30. Also as shown, the radiotelephone 20 includes at least one edge interface connector 75 for electrically connecting the battery 60 to the printed circuit board 50.

Figure 5:
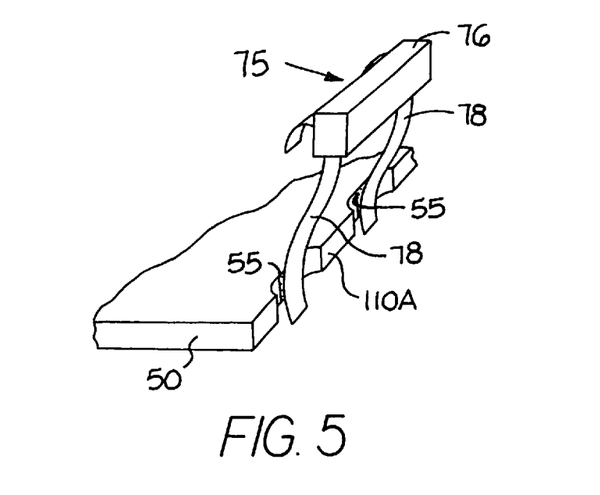
FIG. 5 is an end perspective view of an edge interface connection according to an additional embodiment of the present invention.

The printed circuit board 50 comprises longitudinal and lateral surfaces and is positioned in the housing such that its longitudinal surfaces (FIG. 7A, 100) extend parallel to a plane defined by lines which extend from the top to bottom and side to side of the radiotelephone when held in the hand of a user. As used herein, the lateral surfaces 110 of the printed circuit board are perpendicular to the longitudinal surfaces and can be defined by planes which extend across the width of a radiotelephone (front to back when held in the hand of a user). For example, a rectangular printed circuit board will have two external longitudinal surfaces (top and bottom) and four lateral surfaces (sides). The printed circuit is typically formed on one or more conductive layers of the board separated by insulating layers which comprise the longitudinal surfaces of the board. The lateral surfaces are typically the surfaces which form the edge perimeter walls of the board. Additionally, as shown in FIG. 5, an aperture such as an elongated or circular "via" can be formed normal to the longitudinal surface of the board. Further, an intermediate via can be formed normal to the longitudinal surface and internal of the perimeter edges of the printed circuit board to define an intermediate lateral surface thereat (not shown).

Figure 7:
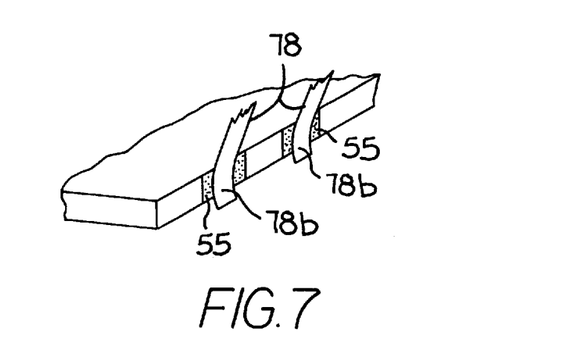
FIG. 7 is a partial perspective view of yet another embodiment of an edge interface connection according to the present invention.
Figure 7A:
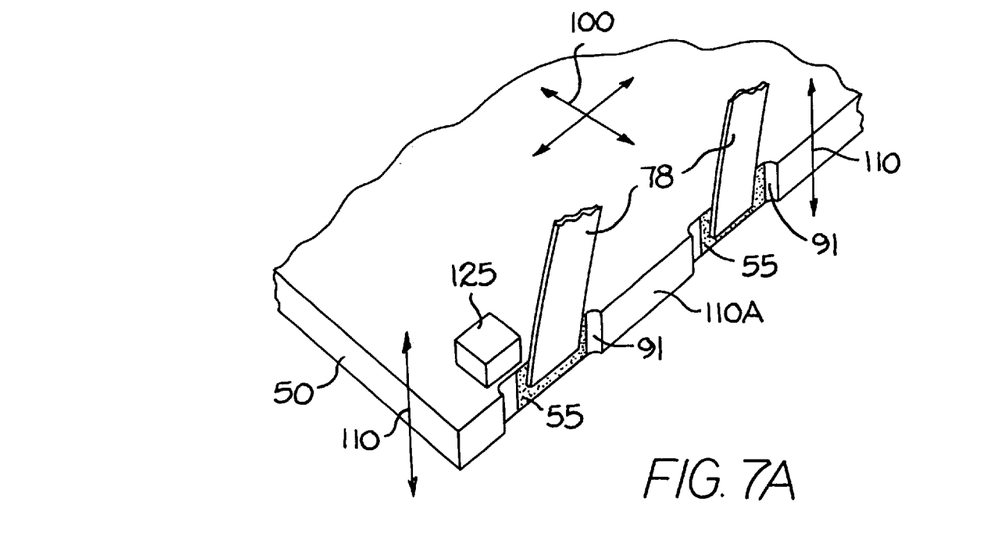
FIG. 7A is a partial perspective view of an alternative embodiment of the embodiment illustrated in FIG. 7.

As shown in FIG. 5, the printed circuit board 50 includes a pair of battery edge contact pads 55 positioned on a lateral surface 110 (preferably an end lateral surface 110a). The battery 60 also includes a corresponding pair of conductive end contacts 65 (FIGS. 3 and 4) preferably positioned on an end portion of the battery in close proximity to the rear housing member 30. The edge interface connector 75 includes upper and lower contact portions 77, 78 which are in electrical communication. Each of the upper contact portions 77 engage with one of the battery contacts 65 and the lower contact portions 78 engage with a corresponding printed circuit board battery edge contact pad 55 to complete a battery circuit path therebetween. Advantageously, as shown in FIG. 7A, the edge interface connection allows 125 to be placed in close proximity to the edge contacts 55 without the need for keep-out zones as generally dictated by conventional designs. For example, conventional designs typically require a keep-out zone which includes not only the contact surface area, but mechanical attachment means of the contacts, and stack-up tolerances between the interconnected components such as between the printed circuit board and housing. Unfortunately, the various stack-up tolerances can be relatively substantial causing a rather large keep-out zone on valuable board space.

Referring again to FIG. 5, the connector 75 preferably includes a support body 76, and is positioned to structurally hold an elongated contact spring 74 which defines the upper and lower contact portions 77, 78. The elongated spring contact 74 allows a natural geometry benefit arising from the length of the lower portion 78 which provides increased spring flexibility or resilience for a more secure connection at the printed circuit board pad 55. The length or configuration of the spring contact 74 provides a smooth force over a longer distance with an associated improved spring constant or (k) value. In the past, the surface area of the elbow or bend of the lower spring was typically sized to obtain a desirable length necessary to provide a desired spring constant value (k). Preferably, the support body 76 is constructed from a plastic, resin, or elastomer body and the upper and lower portions 77, 78 are preferably formed from resilient spring metal legs such as heat treated copper tungsten or beryllium copper. Also preferably, the spring contact upper and lower portions 77, 78 are a continuous length of resilient conductive material which is formed into a desired shape and then inserted (or molded) into the support body 76.

The support body 76 can be assembled to the radiotelephone in any number of ways. Examples of suitable mounting techniques include heat staking, adhesives, and sizing the connector to press or snap fit into one of the housing members. Further, as will be recognized by one of skill in the art, the connector 75 can have many alternative configurations, such as, but not limited to, integrally forming the elongated spring contact 74 (or the upper and lower contact portions 77, 78) in one of the housing members 30, 40 so that a separate support body 76 is not required (not shown).

Figure 5A:
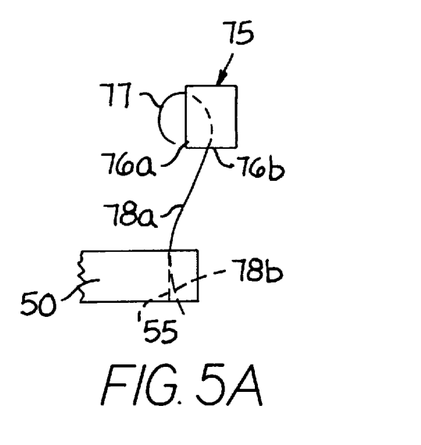
FIG. 5A is a partial side view of the interface illustrated in FIG. 5.
Figure 8:
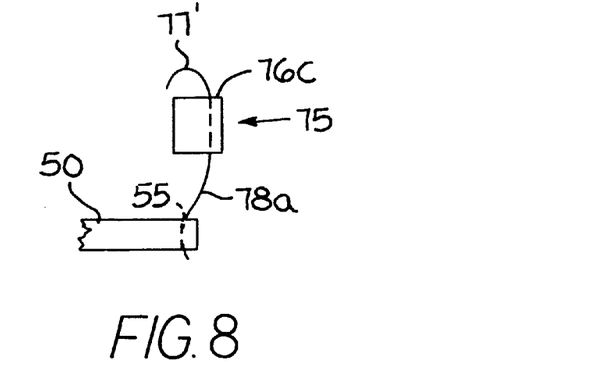
FIG. 8 is a partial end view of an alternative embodiment of an edge interface connection according to the present invention.
Figure 10:
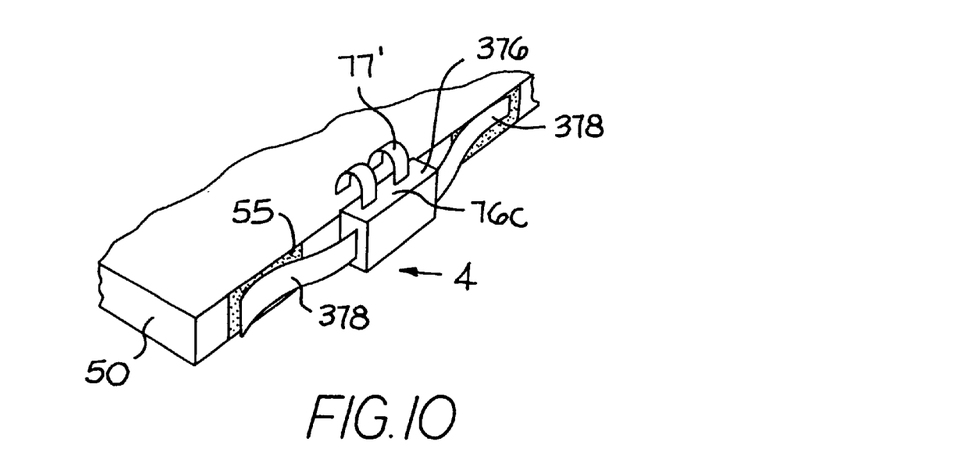
FIG. 10 is a partial perspective view of yet another embodiment of an edge interface connection according to the present invention.

The upper portion of the spring contact 77 is preferably configured to extend a predetermined distance out of the housing so that it can electrically contact with a device such as a battery or other accessory. In one preferred embodiment, as shown in FIG. 5A, the upper portion 77 arcuately extends out of a first side of the support body 76a while the lower portion 78 extends out of a second side of the support body 76b which is adjacent the first side 76a. This configuration positions the upper portion of the connector below or substantially flush with the top of the support body. Alternatively, as shown in FIGS. 8 and 10, the upper portion 77' can extend out of a third side of the support housing 76c such that it is above the support body 76.

Figure 6:
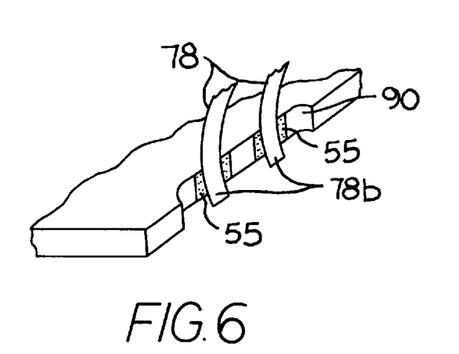
FIG. 6 is a partial end perspective view of an edge interface connection according to another embodiment of the present invention.
Figure 9:
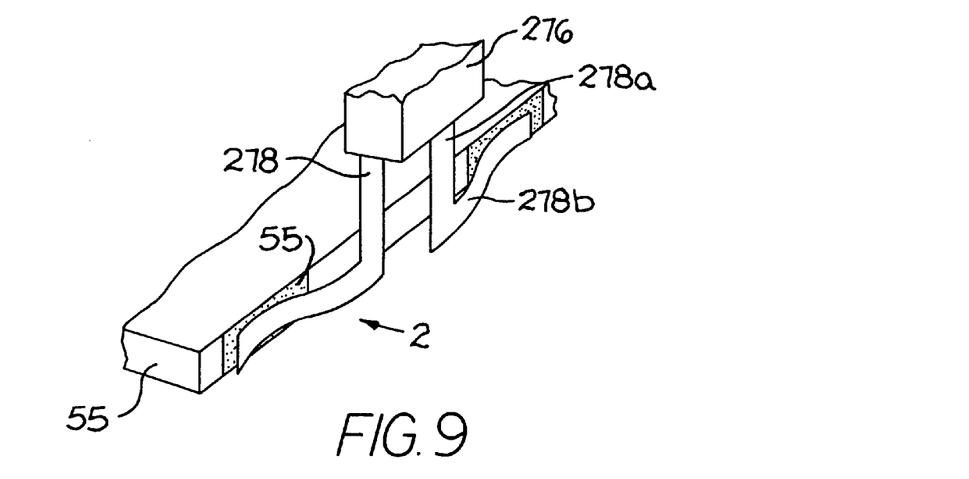
FIG. 9 is a partial perspective view of an additional embodiment of an edge interface connection according to the present invention.

The lower portion of the spring contact 78 includes a lower electrical edge contact 78b and a spring leg 78a. The lower portion of the spring contact an also be configured in numerous ways. Exemplary configurations are illustrated in FIGS. 5, 9, and 10. FIG. 5 illustrates one support body 76 with two vertically extending spring contacts 74. FIG. 9 illustrates one support body 276 with two spring contact lower portions formed in an "L" shape 278. The lower portions 278 include two segments a vertical segment 278a and a horizontal segment 278b which is angularly connected to the first segment (shown as 90 degrees). Advantageously, this configuration can provide increased spring flexibility or resilience. FIG. 10 shows an additional embodiment of a support body 376 with two horizontally extending elongated lower portions 378. In one embodiment, the printed circuit board contact pad and lower spring contact 78b are configured with complementary curvatures (FIG. 6).

Figure 11:
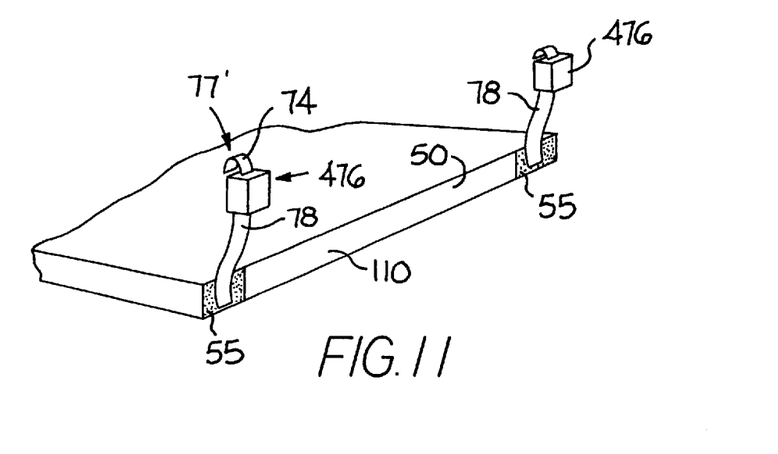
FIG. 11 is a partial perspective view of an additional embodiment of an edge interface connection according to the present invention.

The support body 76 can also be configured in numerous ways. Exemplary support body configurations are shown in FIGS. 3, 5, 10 and 11. FIG. 3 illustrates a support body 76 with a side exiting upper portion 78. FIG. 5 illustrates a horizontally elongated support body 176 holding two side exiting elongated spring contacts 74. FIG. 10 illustrates a rectangular support body 376 with two top exiting upper portions 77' and two horizontally extending lower portions 378. FIG. 11 shows two separate housings 476, each with a single elongated spring contact 74.

This configuration advantageously allows the battery terminals to be separated a distance which will help prevent inadvertent short circuiting across same without sacrificing board space. For example, conventional models, when carried loosely in pockets and the like, can easily short circuit when metallic objects such as pens and car keys, contact the relatively closely spaced terminals either on the battery or phone systems connector. Advantageously, the present invention allows the battery contacts or systems connector contacts to be spaced-apart from the other at a distance that can reduce the likelihood of such an event. For example, as shown in FIG. 11, the contacts 55 are positioned on opposing sides of the lateral contact surface 110 (the battery terminals are correspondingly separated on the battery). Preferably, the battery contacts 55 and correspondingly, the battery terminals 65 are spaced apart 1–4 centimeters. More preferably, they are spaced 3–4 centimeters apart in order to protect and separate the positive and negative terminals.

Figure 11A:
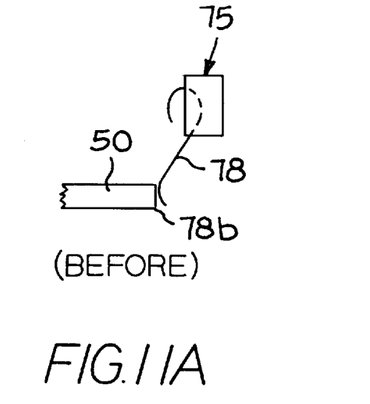
FIG. 11A illustrates one embodiment of the present invention as positioned prior to introduction of an external force thereon.
Figure 11B:
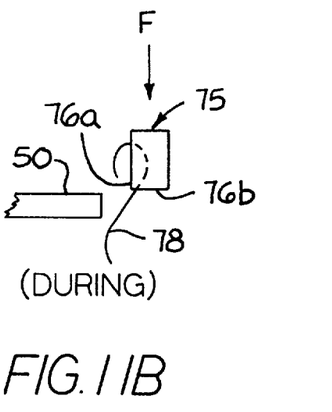
FIG. 11B illustrates the interconnection of FIG. 11A under an externally applied force.
Figure 11C:
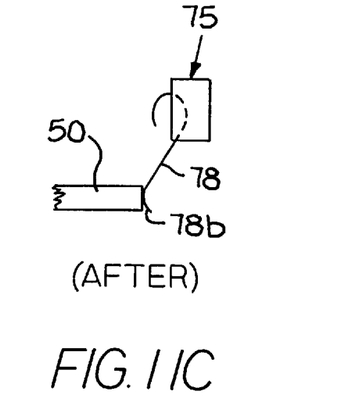
FIG. 11C illustrates the interconnection of FIG. 11A after the force of FIG. 11B has been removed.

As shown in FIGS. 11A–11C, the edge interface contact 78b on the lower portion of the spring 78 is positioned and held adjacent the printed circuit board 50 such that it is free to move about or overshoot the printed circuit board. Stated differently, it is free to extend and retract relative to the printed circuit board 50. Thus, during a mechanical shock, if the spring contact 74 should undergo an elevated force, the lower portion of the spring contact 78 is not trapped by the printed circuit board and is free to extend in response to the forces introduced thereon. Advantageously, such a configuration minimizes the possibility for deformation of the edge contact 78b and, as such, is able to maintain proper electrical contact with the contact pads on the printed circuit board 55 both during and after a mechanical shock The edge contact on the printed circuit board 50 can be formed by a plated contact pad on the edge of the printed circuit board which is electrically connected to the desired circuit components on the printed circuit board. Preferably, the contact pads are formed by plated "via" hole technology which is well known to those of skill in the art. Generally described, a hole (normal to one or more of the longitudinal surfaces) is plated and certain layers (inner, surface, or both) of the printed circuit board (normal to the contact pad or via opening) are used to route the electrical connection to the appropriate location in the circuit path. Alternatively, an added component such as a U-shaped snap on connector can be positioned around an edge of the printed circuit board such that it contacts the top and/or bottom traces and provides the electrical connect pad on the board for the spring contact 74 (not shown). This type of configuration can reduce printed circuit board edge plating costs.

In a preferred embodiment, as shown in FIGS. 5, 6, and 7A, one or more insets (or notches) 90, 91, are formed in the edge contact area and the contact pads 55 are positioned therein. The insets allow the outer wall of the housing and printed circuit board to be positioned in closer proximity by adjusting the spring contact point 78b be positioned in a recessed area of the board. Preferably, the contact pads 55 include serrated edges to minimize trapped dust and the like which may interfere or degrade the electrical connection. Similarly, the spring contact portions 78b can be dimpled to provide similar benefits.

Although the present invention has been described herein with two elongated spring contacts 74 either in a single or separated connector body 76, it will be appreciated by those of skill in the art, that the present invention is not limited thereto. Indeed, a single edge interface connection, or more than two can easily be employed according to the present invention. Similarly, if multiple edge contacts are desired they may be placed on more than one lateral wall (different sides or edges of the printed circuit board).

It is also preferred that the battery be positioned on one end of the radiotelephone 20, more preferably in the bottom to better access external battery rechargers such as base holders. Although described throughout as used to connect a battery, other devices can also be connected to the radiotelephone printed circuit board such as data input components, hands-free kit, in-phone battery chargers, and the like. Further, although primarily aimed at better contacts for cellular phone applications, the present invention is not limited thereto. Indeed, this interconnection technique can also be employed with other electronic devices such as calculators, portable music players, cordless phones, laptop computers, hand held video games, camcorders, and the like. Moreover, the edge interface contact or connection can be used for many applications such as, but not limited to, connections to speakers, microphones, displays, buzzers, systems, charging or AC ports, and the like. Advantageously, the connection can be designed into any corner or space of the product where space is typically unused (such as in extreme corners of telephones, adjacent to assembly screws and the like).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clause are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A radiotelephone, comprising:
   a front housing member;
   a rear housing member configured to overlay and matably connect with said front housing member to provide a channel therebetween, said rear housing member including a battery chamber therein;
   a printed circuit board disposed in said channel intermediate of said front and rear housing members and having a pair of battery edge contact pads thereon; and
   a plurality of elongated spring contacts positioned in said housing rear member such that said spring contacts electrically contact said printed circuit board battery edge contact pads.

2. A radiotelephone according to claim 1, further comprising a battery with positive and negative end contacts thereon assembled in said battery chamber, wherein said positive and negative end contacts are spaced-apart a distance of about at least 3 centimeters.

3. A radiotelephone according to claim 1, wherein said elongated spring contacts are free to vertically extend and retract about said printed circuit board according to external forces exerted thereupon.

4. A radiotelephone according to claim 1, wherein said printed circuit board battery edge contact pads are positioned in at least one cutaway inset in an end of said printed circuit board.

5. A radiotelephone according to claim 1, wherein said elongated spring contacts include upper and lower portions, and wherein said elongated spring contacts include at least one support body positioned between the upper and lower portions of said elongated spring contacts.

6. A radiotelephone according to claim 2, wherein said plurality of spring contacts include positive and negative spring contacts having upper and lower portions, and wherein said battery is positioned in said chamber such that the upper portions of said positive and negative spring contacts engage said respective battery positive and negative end contacts and the lower end portions contact respective ones of said battery edge contact pads on said printed circuit board defining a battery circuit therebetween.

7. A radiotelephone according to claim 5, wherein said support body is integral to an end portion of said rear housing member.

8. A radiotelephone according to claim 5, wherein said plurality of elongated spring contacts comprise first and second elongated spring contacts.

9. A radiotelephone according to claim 5, wherein said first and second elongated spring contact lower portions include horizontal contact legs.

10. A radiotelephone according to claim 5, wherein said at least one support body is two separate support bodies.

11. A radiotelephone according to claim 8, wherein said printed circuit board includes a lateral edge portion and wherein said battery edge contact pads are positioned on the lateral edge portion, and wherein said first and second elongated spring contacts include upper and lower portions such that said lower portions extend substantially parallel to the lateral edge portion of said printed circuit board to electrically engage with selected ones of said printed circuit board laterally positioned contact pads.

12. A radiotelephone according to claim 9, wherein said lower portions are configured in an L shape such that the lower edge of said lower portion defines said horizontal contact legs.

13. An edge interface electrical connection, comprising:

a connector support body having first and second sides;

at least one connector upper contact extending from a first side of said support body;

at least one connector lower contact extending from a second side of said support body, wherein each of said connector upper contacts are electrically connected to corresponding ones of said at least one connector lower contacts;

a printed circuit board having longitudinal and lateral surfaces and comprising at least one lateral edge contact pad on at least one lateral surface, wherein said connector lower contact extends from said support body in a direction which is generally perpendicular to said printed circuit board longitudinal surface to rest against and electrically connect with said printed circuit board lateral edge contact pad.

14. An edge interface electrical connection according to claim 13, wherein said connector upper contact arcuately extends from said first side of said support body.

15. An edge interface electrical connection according to claim 13, wherein said connector lower contact extends substantially vertically downward from said second side of said support body and is free to extend upwardly and downwardly about said printed circuit board in response to forces exerted thereon.

16. An edge interface electrical connection according to claim 13, wherein said connector lower contact extends substantially horizontally from said second side of said support body and is free to extend upwardly and downwardly about said printed circuit board in response to forces exerted thereon.

17. An edge interface electrical connection according to claim 13, wherein said connector lower contact includes first and second segments such that said second segment extends at an angle with respect to said first segment and wherein said second segment engages with said lateral edge contact and is free to extend upwardly and downwardly about said printed circuit board in response to forces exerted thereon.

18. An edge interface electrical connection according to claim 13, wherein said printed circuit board includes electrical contact pads positioned in at least cutaway inset in said printed circuit board.

19. An edge interface electrical connection according to claim 13, wherein said at least one upper and lower connector contact is two spaced apart connector contacts, each of the upper connector contacts being spaced apart and each of the lower connector contacts being spaced apart, and wherein each upper connector contact is electrically connected to a corresponding lower connector contact.

20. An edge interface electrical connection according to claim 19, wherein said two spaced apart connector contacts define positive and negative power source contacts.

21. An edge interface electrical connection according to claim 19, wherein at least one lateral edge contact pad of said printed circuit board comprises first and second contact pads positioned such that each is spaced-apart from each other on one lateral side of said printed circuit board, and wherein each of said two electrically separate connector lower contacts engages a respective one of said first or second printed circuit board lateral edge contact pads.

22. An edge interface electrical connection according to claim 20, wherein each of said upper contacts are configured to engage with terminals of a power source.

\* \* \* \* \*

UNITED STATES PATENT AND TRADEMARK OFFICE
CERTIFICATE OF CORRECTION

PATENT NO. : 5,910,025
DATED : 8 June 1999
INVENTOR(S) : Gregory S. Mendolia

It is certified that error appears in the above-identified patent and that said Letters Patent is hereby corrected as shown below:

Column 5, line 39 after "...the edge interface connection allows", reinsert --other components--

Column 7, line 21 "The edge contact..." begins a new paragraph.

Signed and Sealed this

First Day of February, 2000

Attest:

Attesting Officer

Q. TODD DICKINSON

Acting Commissioner of Patents and Trademarks